(12) United States Patent
Lin et al.

(10) Patent No.: US 11,183,563 B2
(45) Date of Patent: Nov. 23, 2021

(54) SUBSTRATE STRUCTURE AND METHOD FOR FABRICATING SEMICONDUCTOR STRUCTURE INCLUDING THE SUBSTRATE STRUCTURE

(71) Applicant: Vanguard International Semiconductor Corporation, Hsinchu (TW)

(72) Inventors: Yung-Fong Lin, Taoyuan (TW); Cheng-Tao Chou, Huwei Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 55 days.

(21) Appl. No.: 16/593,208

(22) Filed: Oct. 4, 2019

(65) Prior Publication Data
US 2021/0104604 A1   Apr. 8, 2021

(51) Int. Cl.
*H01L 29/10*   (2006.01)
*H01L 29/20*   (2006.01)
*H01L 29/778*  (2006.01)
*H01L 29/66*   (2006.01)

(52) U.S. Cl.
CPC ...... *H01L 29/1075* (2013.01); *H01L 29/2003* (2013.01); *H01L 29/66462* (2013.01); *H01L 29/7786* (2013.01)

(58) Field of Classification Search
CPC ......... H01L 21/02389; H01L 21/02447; H01L 21/02488
See application file for complete search history.

(56) References Cited

U.S. PATENT DOCUMENTS

| 2015/0325656 A1* | 11/2015 | Abbondanza | H01L 21/02532 438/478 |
| 2016/0126099 A1* | 5/2016  | Shikauchi  | H01L 21/0259 257/655 |
| 2019/0172709 A1* | 6/2019  | Odnoblyudov | H01L 21/02488 |

OTHER PUBLICATIONS

Office Action Taiwanese Application No. 108112979, dated Aug. 19, 2019.

\* cited by examiner

*Primary Examiner* — Raj R Gupta
(74) *Attorney, Agent, or Firm* — Birch, Stewart, Kolasch & Birch, LLP

(57) ABSTRACT

A substrate structure and a method for fabricating a semiconductor structure including the substrate structure are provided. The substrate structure includes a substrate, a bow adjustment layer, and a silicon layer. The bow adjustment layer is on the top surface of the substrate. The silicon layer is on the bow adjustment layer. The substrate structure has a total bow value, and the total vow value is from −20 μm to −40 μm.

7 Claims, 6 Drawing Sheets

SUBSTRATE STRUCTURE AND METHOD FOR FABRICATING SEMICONDUCTOR STRUCTURE INCLUDING THE SUBSTRATE STRUCTURE

BACKGROUND

Technical Field

The present disclosure relates to semiconductor fabricating technology, and more particularly to substrate structures for growing a GaN-based semiconductor material, and methods for fabricating semiconductor structures including the same.

Description of the Related Art

Gallium nitride-based (GaN-based) semiconductor materials have many excellent characteristics, such as high thermal resistance, wide band-gap, and high electron saturation rates. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMTs) with heterogeneous interfacial structures.

With the development of GaN-based semiconductor materials, semiconductor structures that use GaN-based semiconductor materials are applied in more critical working environments, such as those with higher frequencies, higher temperatures, or higher voltages. Therefore, the process conditions of fabricating semiconductor devices with GaN-based semiconductor materials face various new challenges.

SUMMARY

Some embodiments of the present disclosure provide a semiconductor structure. The semiconductor structure includes a substrate, a bow adjustment layer, and a silicon layer. The bow adjustment layer is on the top surface of the substrate. The silicon layer is on the bow adjustment layer. The substrate structure has a total bow value, and the total bow value is from −20 µm to −40 µm.

Some embodiments of the present disclosure provide a method for fabricating a semiconductor structure. The method includes forming a substrate structure; and forming a GaN-based semiconductor layer over the substrate structure. Forming the substrate structure includes providing a substrate; and forming a bow adjustment layer on the top surface of the substrate to adjust the total bow value of the substrate structure to be less than 50 µm.

The semiconductor structures of the present disclosure can be applied to various types of semiconductor devices. In order to make features and advantages of the present disclosure easy to understand, a detailed description with reference to the accompanying drawings is given in the following embodiments where the semiconductor structures are applied to HEMTs.

BRIEF DESCRIPTION OF THE DRAWINGS

In order to make features and advantages of the present disclosure easier to understand, a detailed description is given in the following various embodiments with reference to the accompanying drawings.

DETAILED DESCRIPTION

Figure 1A:
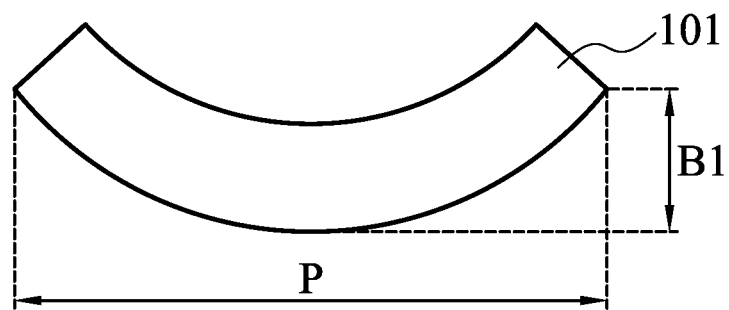
FIGS. 1A-1F illustrate cross-sectional views of forming a semiconductor structure at various intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Embodiments of the present disclosure provide substrate structures and methods for fabricating semiconductor structures including the substrate structures. In the embodiments of the present disclosure, the method for fabricating a semiconductor structure includes using a bow adjustment layer to adjust the total bow value of a substrate structure to be less than about 50 µm, such that the total bow value of a semiconductor structure, which is subsequently formed after a GaN-based semiconductor layer is deposited, can be less than about 80 µm. Thus, cracking of films formed thereon subsequently can be prevented, and the yield as well as quality of the semiconductor structure can be improved.

FIGS. 1A-1F illustrate cross-sectional views of forming a semiconductor structure at various intermediate stages in accordance with some embodiments of the present disclosure. Please refer to FIGS. 1A-1B, a substrate 102 is provided.

According to some embodiments of the present disclosure, the substrate 102 is formed by powder metallurgy in which powders are sintered at a high temperature. Please refer to FIG. 1A, in some embodiments, a plurality of substrate material powders (not shown in drawings) are provided, and then a high-temperature process is performed on these substrate material powders, so that the substrate material powders are sintered to form a substrate 101 shown in FIG. 1A. After the high-temperature process is performed, the as-formed substrate 101 usually bows, and it may have a bow value B1 that is, for example, from about 50 µm to about −50 µm. Moreover, the two opposite surfaces of the substrate 101 may have substantially the same curvatures.

In some embodiments, the substrate material powders include ceramic material powders including, for example, aluminum nitride, silicon carbide, aluminum oxide, or a combination thereof. In some embodiments, the temperature of the high-temperature process is, for example, from about 1500° C. to about 1900° C.

Figure 1B:
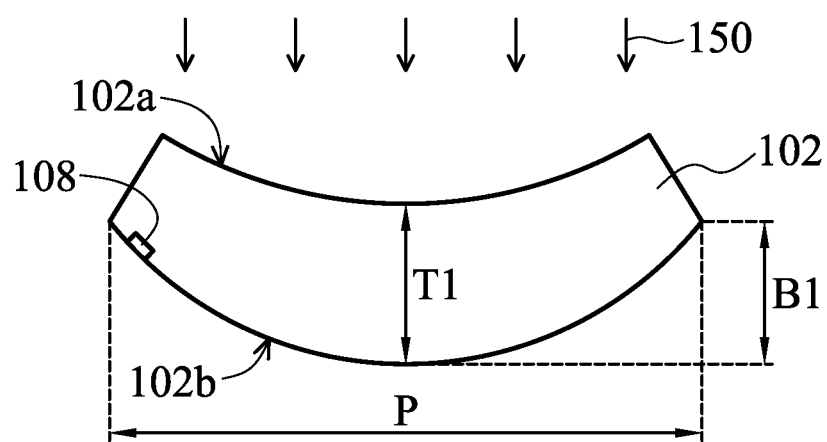

Next, please refer to FIG. 1B, a grinding step 150 may be performed to grind the top surface of the substrate 101, such that the curvature of the ground top surface 102a of the substrate 102 is smaller than the curvature of the bottom surface 102b of the substrate 102; that is, the ground top surface 102a is more planar than the unground bottom surface 102b. As shown in FIG. 1B, the bottom surface 102b of the substrate 102 is opposite to the top surface 102a of the substrate 102. According to some embodiments of the present disclosure, the top surface 102a after grinding is more planar and thus can help the subsequently formed films to grow more uniformly as well as having better adhesion.

In some embodiments, as shown in FIG. 1B, the bow value B1 of the substrate 102 may be a negative value, so that the top surface 102a of the substrate 102 has a concave profile. After the top surface 102a of the substrate 102 is ground, the top surface 102a of the substrate 102 may still have a concave profile, but the extent of the recess is reduced by the grinding step. In some other embodiments, the bow value B1 of the substrate 102 may be a positive value as well (not shown in FIG. 1B), so that the top surface 102a of the substrate 102 may have a convex profile.

In some embodiments, before grinding the substrate 101, a bow measurement may be performed on the substrate 101 to obtain a bow value. The value may be a positive value or a negative value depending on the arrangement of the substrate. The top surface (i.e., the surface on which the grinding step is supposed to perform subsequently) and the bottom surface of the substrate 101 are defined based on a reference where the bow value of the substrate 101 is a negative value. In other words, after the bow measurement, the substrate 101 is determined to be arranged so as to have a negative bow value. Thus, as shown in FIG. 1A, the top surface of the substrate 101 has a concave profile, the bottom surface of the substrate 101 has a convex profile, and the bow value B1 of the substrate 101 is a negative value.

In some embodiments of the present disclosure, the bow adjustment layer 104 is used to adjust the total bow value of the substrate structure in subsequent steps, and then a GaN-based semiconductor layer having a positive bow value will be formed on the substrate structure. When the substrate structure has a negative bow value, this is advantageous to compensating the positive bow value of the GaN-based semiconductor layer. Therefore, according to some embodiments of the present disclosure, a bow measurement is first performed on the substrate 101 in order to arrange the substrate 101 to allow it to have a negative bow value, such that the following adjustment extent of the bow can be reduced. As such, the required thickness of the bow adjustment layer 104 formed subsequently can be reduced, and thus the thickness of the overall device structure can be further reduced. In addition, such design can still effectively utilize the negative total bow value of the substrate structure to compensate the positive bow value of the GaN-based semiconductor layer. Accordingly, the as-formed structure including the GaN-based semiconductor layer can have a relatively flat structure and a planar top surface, which is advantageous to the growths of films in the following manufacturing process.

In some embodiments, as shown in FIG. 1B, a mark 108 may be formed on the bottom surface of the substrate 101 after the bow measurement for defining the top surface and the bottom surface of the substrate 101 is performed on the substrate 101. In some embodiments, the mark 108 is a laser mark. In some embodiments, the step of forming the mark may be performed prior to performing the grinding step 150. Forming the mark 108 on the bottom surface of the substrate 101 is beneficial to efficiently picking up the top surface that is to be ground, so that the yield of the manufacturing steps of the semiconductor structure can be increased.

In some embodiments, the substrate 102 may be circular, and the substrate 102 has a diameter P which may be 4 inches or more, such as 6 inches, 8 inches, or 12 inches, making it suitable for use in manufacturing equipment used in the semiconductor industry.

In some embodiments, the substrate 102 is a ceramic substrate. For example, the substrate 102 may be an aluminum nitride (AlN) substrate, a silicon carbide (SiC) substrate, a sapphire substrate, suitable similar substrates, or a combination thereof. In some embodiments, the substrate 102 is an aluminum nitride (AlN) substrate.

In some embodiments, the substrate 102 may be used to fabricate a semiconductor device including a GaN-based semiconductor layer, such as a light-emitting diode (LED), a high frequency device, or a high voltage device. The high frequency device or the high voltage device may be, for example, a high electron mobility transistor (HEMT), a Schottky bipolar diode (SBD), a bipolar junction transistor (BJT), a junction field effect transistor (JFET), or an insulated gate bipolar transistor (IGBT).

Figure 1C:
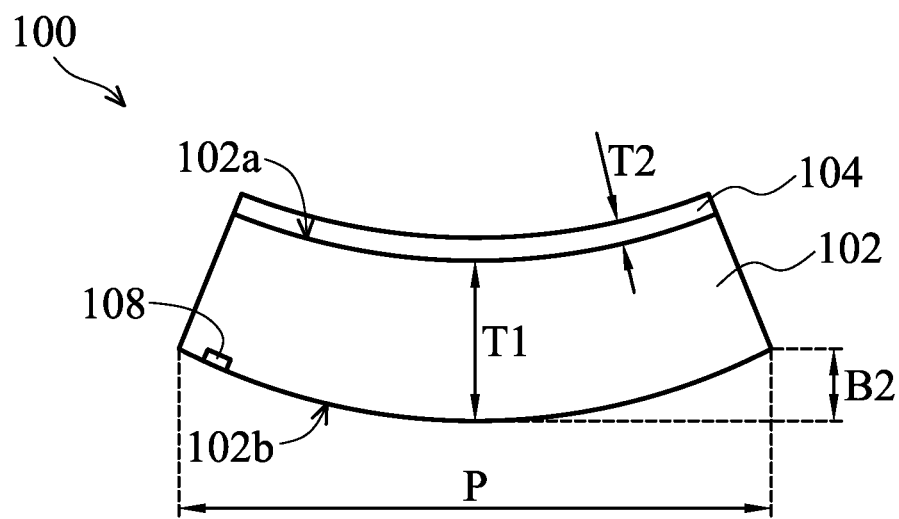

Next, please refer to FIG. 1C, a bow adjustment layer 104 is formed on the top surface 102a of the substrate 102 to adjust the total bow value of the substrate structure to be less than 50 µm. In some embodiments, the total bow value B2 of the substrate structure 100 is adjusted to be a negative value, for example, in a range from less than 0 µm to about −50 µm. In some embodiments, the bow adjustment layer 104 is formed on the top surface 102a of the substrate 102 to adjust the total bow value of the substrate structure 100 to be from about −20 µm to about −40 µm.

In some embodiments, the bow adjustment layer 104 may be deposited on the top surface 102a of the substrate 102 by a deposition process. In some embodiments, the deposition process includes a plasma-enhanced chemical vapor deposition (PECVD) process, a sub-atmospheric chemical vapor deposition (SACVD) process, or a combination thereof.

In some embodiments, the bow adjustment layer 104 includes silicon oxide, silicon nitride, silicon oxynitride, silicon carbide, or a combination thereof. In some embodiments, the bow adjustment layer 104 has a thickness T2 that is from about 0.3 µm to about 2.5 µm. In some embodiments, the thickness T2 of the bow adjustment layer 104 is from about 0.5 µm to about 1.5 µm.

In some embodiments, a silicon oxide layer that serves as the bow adjustment layer 104 may be deposited on the top surface 102a of the substrate 102 by plasma-enhanced chemical vapor deposition (PECVD) using silane ($SiH_4$) and oxygen gas as the precursor and the reactive gas. Under this condition, when the deposited thickness is about 0.5 µm, the bow value of the silicon oxide layer (bow adjustment layer 104) is about 5 μm to about 10 μm; when the deposited thickness is about 1 μm, the bow value of the silicon oxide layer (bow adjustment layer 104) is about 25 μm to about 30 μm; when the deposited thickness is about 1.5 μm, the bow value of the silicon oxide layer (bow adjustment layer 104) is about 35 μm to about 40 μm.

In some other embodiments, a silicon oxide layer that serves as the bow adjustment layer 104 may be deposited on the top surface 102a of the substrate 102 by sub-atmospheric chemical vapor deposition (SACVD) using silane ($SiH_4$) and oxygen gas as the precursor and the reactive gas. Under this condition, when the deposited thickness is about 0.5 μm, the bow value of the silicon oxide layer (bow adjustment layer 104) is about 0 μm to about −5 μm; when the deposited thickness is about 1 μm, the bow value of the silicon oxide layer (bow adjustment layer 104) is about −18 μm to about −23 μm; when the deposited thickness is about 1.5 μm, the bow value of the silicon oxide layer (bow adjustment layer 104) is about −26 μm to about −31 μm.

As described above, according to some embodiments of the present disclosure, according to the bow value of the substrate 102, a bow adjustment layer 104 that has a suitable and compatible bow value may be selected to be formed on the surface 102a of the substrate 102, so that the total bow value of the substrate structure can be adjusted to be less than 50 μm. For example, when the bow value of the substrate 102 is about −50 μm, a bow adjustment layer 104 having a bow value of about 20 μm formed on the top surface 102a of the substrate 102 can adjust the total bow value of the overall structure of the substrate 102 and the bow adjustment layer 104 (i.e., the total bow value B2 of the substrate structure 100) to be substantially about −30 μm, and the overall structure having a negative total curvature has a concave top surface.

It should be noted that the above embodiments are merely examples and are not intended to be limiting. The bow adjustment layer 104 of the present disclosure is not limited to be made by the manufacturing methods, materials, and having the above thickness, etc. described in the above embodiments. Those skilled in the art should appreciate that other suitable manufacturing methods, materials, thicknesses, etc. may be selected for manufacturing the bow adjustment layer 104 on the top surface 102a of the substrate 102 based on the spirit and scope of the present disclosure.

According to some embodiments of the present disclosure, as shown in FIG. 1C, the substrate structure 100 may include the substrate 102 and the bow adjustment layer 104, and the total bow value B2 of the substrate structure 100 is substantially equal to the sum of the bow value of the substrate 102 and the bow value of the bow adjustment layer 104. In some embodiments, the diameter of the substrate structure 100 is substantially equal to the diameter P of the substrate 102, and the diameter of the substrate structure 100 is about 6 inches to about 8 inches.

Figure 1D:
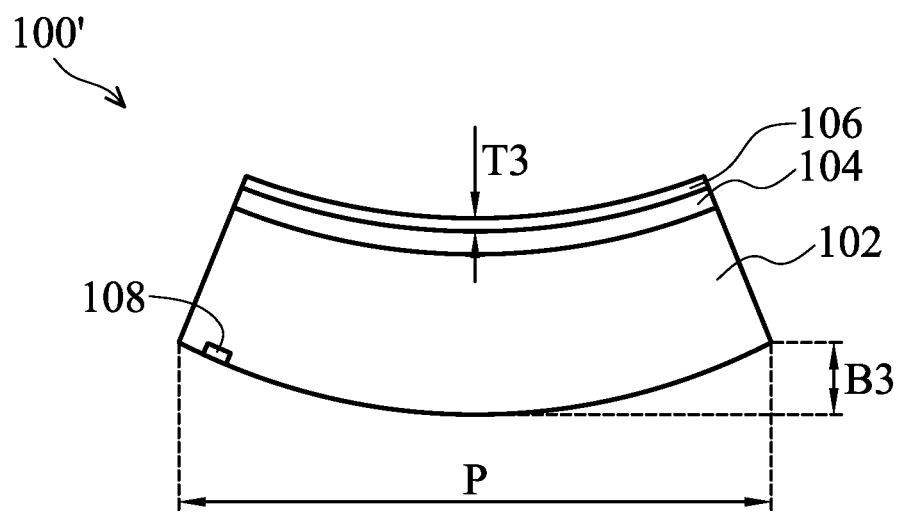

Next, in some embodiments, please refer to FIG. 1D, the step of forming the substrate structure may further include forming a silicon layer 106 on the bow adjustment layer 104. In some embodiments, the silicon layer 106 may be formed by a deposition process.

In some embodiments, the silicon layer 106 has a thickness T3 that is from about 0.1 μm to about 0.6 μm. In some embodiments, the thickness T3 of the silicon layer 106 is from about 0.2 μm to about 0.5 μm. In some embodiments, the thickness T3 of the silicon layer 106 is about 0.35 μm.

According to some embodiments of the present disclosure, as shown in FIG. 1D, the substrate structure 100' may include the substrate 102, the bow adjustment layer 104, and the silicon layer 106, and the total bow value B3 of the substrate structure 100' is substantially equal to the sum of the bow value of the substrate 102, the bow value of the bow adjustment layer 104, and the bow value of the silicon layer 106. In some embodiments, the diameter of the substrate structure 100' is substantially equal to the diameter P of the substrate 102, and the diameter of the substrate structure 100' is about 6 inches to about 8 inches.

Figure 1E:
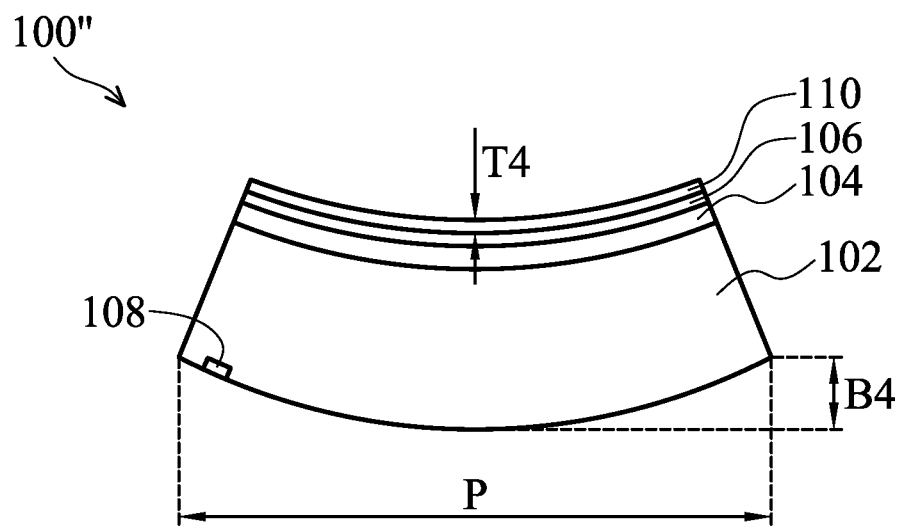

Next, in some embodiments, please refer to FIG. 1E, the step of forming the substrate structure may further include forming a buffer layer 110 on the silicon layer 106. In some embodiments, the buffer layer 110 has a thickness T4 that is from about 0.2 μm to about 0.5 μm. In some embodiments, the material of the buffer layer 110 may be AlN, GaN, $Al_xGa_{1-x}N$ (wherein 0<x<1), suitable similar materials, or a combination thereof. In some embodiments, the buffer layer 110 may be formed by using an epitaxial growth process, such as metal organic chemical vapor deposition (MOCVD), hydride vapor phase epitaxy (HVPE), molecular beam epitaxy (MBE), suitable similar methods, or a combination thereof. Although the buffer layer 110 is a single layer in the embodiment, as shown in FIG. 1E, the buffer layer 110 may also be a multilayered structure.

According to some embodiments of the present disclosure, as shown in FIG. 1E, the substrate structure 100'' may include the substrate 102, the bow adjustment layer 104, the silicon layer 106, and the buffer layer 110, and the total bow value B4 of the substrate structure 100'' is substantially equal to the sum of the bow value of the substrate 102, the bow value of the bow adjustment layer 104, the bow value of the silicon layer 106, and the bow value of the buffer layer 110. In some embodiments, the diameter of the substrate structure 100'' is substantially equal to the diameter P of the substrate 102, and the diameter of the substrate structure 100'' is about 6 inches to about 8 inches.

Figure 1F:
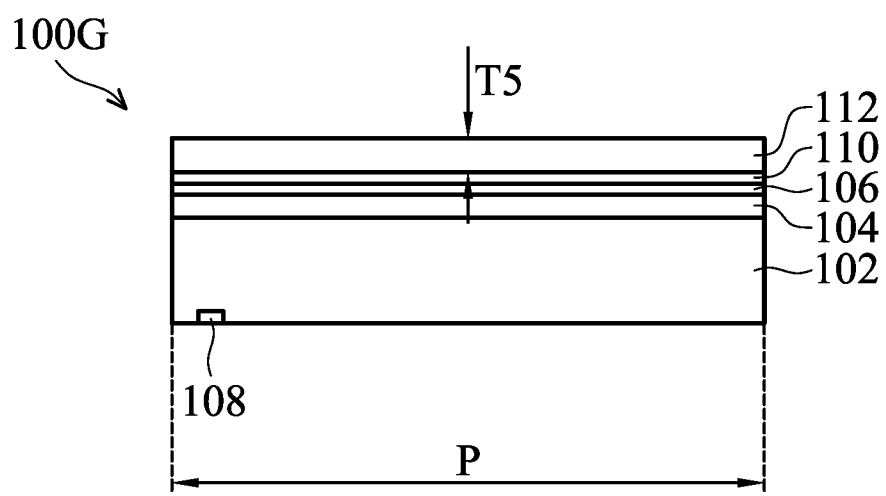

Next, according to some embodiments of the present disclosure, a GaN-based semiconductor layer is formed on the substrate structure. In some embodiments, the GaN-based semiconductor layer is, for example, the GaN semiconductor layer 112 or the AlGaN semiconductor layer as shown in FIG. 1F. In some embodiments, the GaN-based semiconductor layer may be formed by using an epitaxial growth process, such as metal organic chemical vapor deposition (MOCVD), hydride vapor phase epitaxy (HVPE), molecular beam epitaxy (MBE), suitable similar methods, or a combination thereof. In some embodiments, please refer to FIG. 1F, for example, the GaN semiconductor layer 112 is formed on the substrate structure 100'' to form a semiconductor structure 100G shown in FIG. 1F.

In some embodiments, the processing temperature for forming the GaN semiconductor layer 112 may be from about 800° C. to about 1000° C. Since the GaN semiconductor layer 112 is formed by a high-temperature process, the GaN semiconductor layer 112 usually has a positive bow value. In some embodiments, the GaN semiconductor layer 112 has a thickness T5 that is from about 5 μm to about 15 μm. In some embodiments, when the thickness T5 of the GaN semiconductor layer 112 is about 5 μm, the bow value is about 30 μm to about 40 μm.

In some embodiments, the total bow value of the substrate structure is adjusted to be less than about 50 μm, such that the as-formed semiconductor structure with a deposited GaN-based semiconductor layer can have a total bow value of less than about 80 μm. Thus, cracking of films formed thereon subsequently can be prevented, and the yield as well as quality of the semiconductor structure can be improved.

In some embodiments, when the total bow value B2 of the substrate structure 100, the total bow value B3 of the substrate structure 100', or the total bow value B4 of the substrate structure 100" is adjusted by the bow adjustment layer 104 to be within a range from −20 μm to −40 μm, and then the GaN semiconductor layer 112 having a bow value that is from about 30 μm to about 40 μm is formed on the substrate structure, the total bow value of the overall structure can be within a range from about −10 μm to about 20 μm through the compensation between the respective bow values. Thus, the overall structure has a relatively flat top surface. As a result, cracking of films formed thereon subsequently due to overlarge curvature can be prevented, further deposition processes of films on the GaN semiconductor layer 112 subsequently can be facilitated, the uniformity and adhesion of the films can be improved, and the yield as well as quality of the semiconductor structure can be further improved.

FIGS. 2A-2D illustrate cross-sectional views of forming a substrate structure at various intermediate stages in accordance with some embodiments of the present disclosure. The elements in the present embodiment sharing the same or similar labels with those in the previous embodiment are the same or similar elements, the description of which is omitted.

Figure 2A:
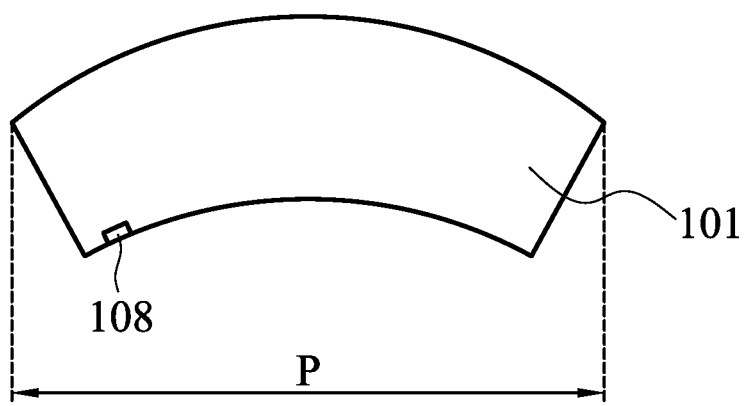
FIGS. 2A-2D illustrate cross-sectional views of forming a substrate structure at various intermediate stages in accordance with some embodiments of the present disclosure.

Please refer to FIG. 2A, a high-temperature process is performed on the substrate material powders, so that the substrate material powders are sintered to form a substrate 101 shown in FIG. 2A. The substrate 101 may have a bow value B1 that is from about 50 μm to about −50 μm. Moreover, the two opposite surfaces of the substrate 101 may have substantially the same curvatures.

Next, as shown in FIG. 2A, a mark 108 is formed on the selected bottom surface of the substrate 101.

Figure 2B:
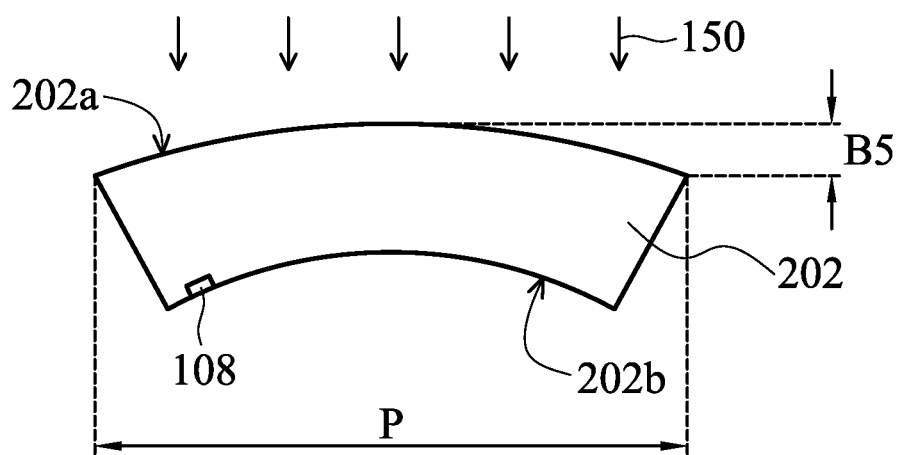

Next, please refer to FIG. 1B, a grinding step 150 may be performed to grind the top surface of the substrate 101, such that the curvature of the ground top surface 202a of the substrate 202 is smaller than the curvature of the bottom surface 202b of the substrate 202; that is, the ground top surface 202a is more planar than the unground bottom surface 202b. As shown in FIG. 2B, the bottom surface 202b of the substrate 202 is opposite to the top surface 202a of the substrate 202, and the mark 108 located on the bottom surface 202b of the substrate 202.

In some embodiments, as shown in FIG. 2B, the bow value B5 of the substrate 202 may be positive, so that the top surface 202a of the substrate 202 has a convex profile, and the bottom surface 202b of the substrate 202 has a concave profile. After the top surface 202a of the substrate 202 is ground, the top surface 202a of the substrate 202 may still have a convex profile, but the protruding extent is reduced by the grinding step.

Figure 2C:
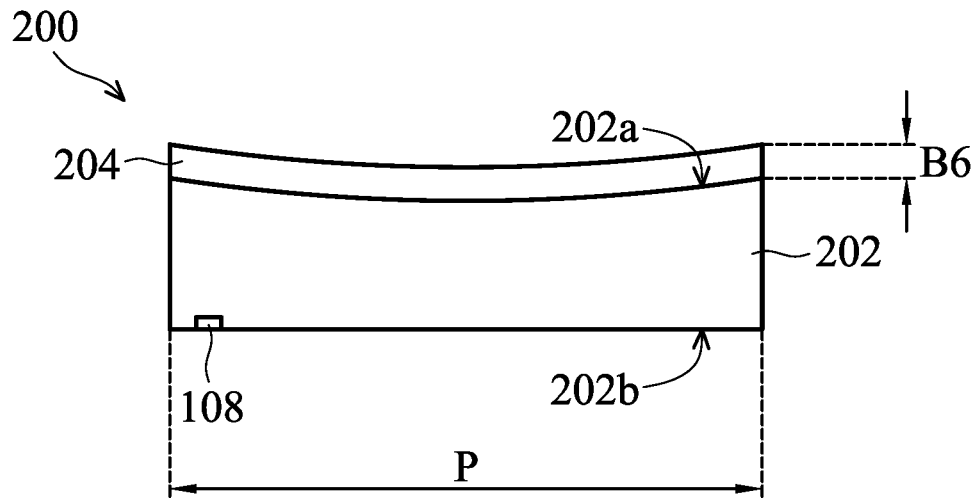

Next, please refer to FIG. 2C, a bow adjustment layer 104 is formed on the top surface 202a of the substrate 202 to adjust the total bow value of the substrate structure to be less than 50 μm. In some embodiments, as shown in FIG. 2C, the total bow value B6 of the substrate structure 200 is adjusted to be a negative value, for example, in a range from less than 0 μm to about −50 μm. In some embodiments, the bow adjustment layer 104 is formed on the top surface 202a of the substrate 202 to adjust the total bow value of the substrate structure 200 to be from about −20 μm to about −40 μm.

As described above, according to some embodiments of the present disclosure, according to the bow value of the substrate 202, a bow adjustment layer 104 that has a suitable and compatible bow value may be selected to be formed on the surface 202a of the substrate 202, so that the total bow value of the substrate structure can be adjusted to be less than 50 μm. For example, when the bow value B5 of the substrate 202 is about 10 μm, a bow adjustment layer 104 having a bow value of about −30 μml formed on the top surface 202a of the substrate 202 can adjust the total bow value of the overall structure of the substrate 202 and the bow adjustment layer 104 (i.e., the total bow value B6 of the substrate structure 200) to be substantially about −20 μm, as shown in FIG. 2C, and the overall structure having a negative total curvature has a concave top surface.

Figure 2D:
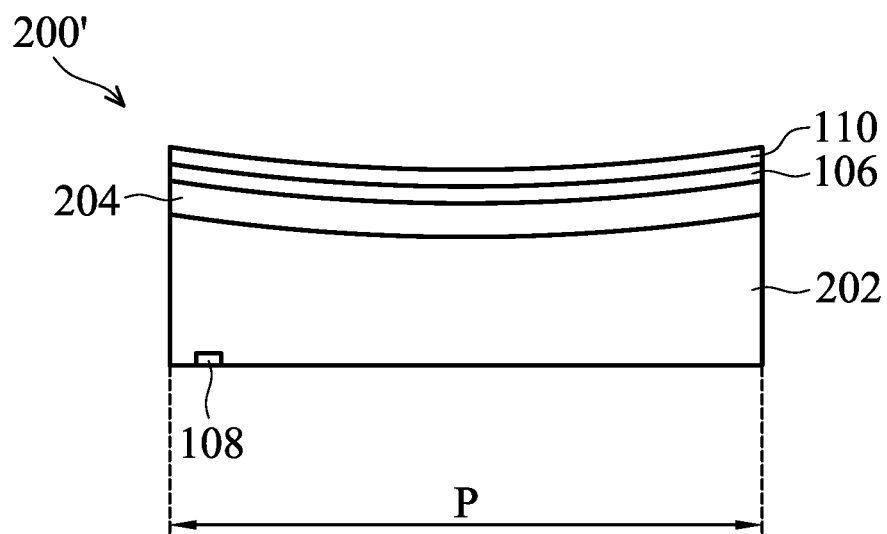

Next, in some embodiments, please refer to FIG. 2D, the step of forming the substrate structure may further include forming a silicon layer 106 on the bow adjustment layer 104. Next, in some embodiments, please refer to FIG. 2D, the step of forming the substrate structure may further include forming a buffer layer 110 on the silicon layer 106 so as to form the substrate structure 200'.

Next, according to some embodiments of the present disclosure, a GaN-based semiconductor layer is formed on the substrate structure. In some embodiments, please refer to FIG. 2D, for example, the GaN semiconductor layer 112 as shown in FIG. 1F is formed on the substrate structure 200'.

In some embodiments, when the total bow value B6 of the substrate structure is adjusted by the bow adjustment layer 104 to be within a range from −20 μm to −40 μm, and then the GaN semiconductor layer 112 having a bow value that is from about 30 μm to about 40 μm is formed on the substrate structure, the total bow value of the overall structure can be within a range from about −10 μm to about 20 μm through the compensation between the respective bow values. Thus, the overall structure has a relatively flat top surface. As a result, cracking of films formed thereon subsequently due to overlarge curvature can be prevented, further deposition processes of films on the GaN semiconductor layer 112 subsequently can be facilitated, the uniformity and adhesion of the films can be improved, and the yield as well as quality of the semiconductor structure can be further improved.

Figure 3:
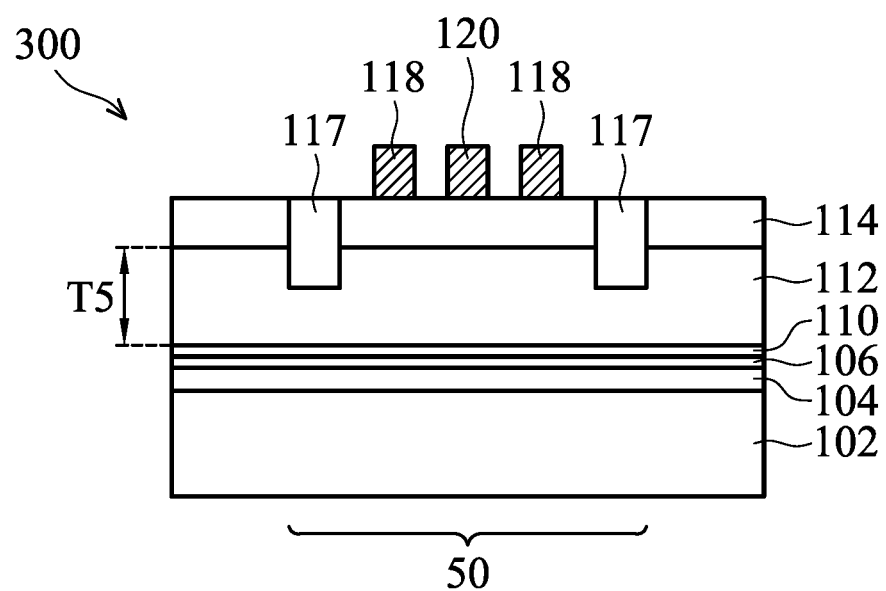
FIG. 3 shows a cross-sectional view of a HEMT formed by using the substrate structure in FIG. 1E in accordance with some embodiments of the present disclosure.

FIG. 3 shows a cross-sectional view of a HEMT formed by using the substrate structure 100" in FIG. 1E in accordance with some embodiments of the present disclosure. The HEMT shown in FIG. 3 may also be formed by using the substrate structure 100 in FIG. 1C, the substrate structure 100' in FIG. 1D, the substrate structure 200 in FIG. 2C, or the substrate structure 200' in FIG. 2D. The manufacturing steps are similar to those described in the following embodiments, and the details are not repeated. Besides, the elements in the present embodiment sharing the same or similar labels with those in the previous embodiments are the same or similar elements, the description of which is omitted.

Generally, the breakdown voltage of a HEMT mainly depends on the thickness of the GaN semiconductor layer which serves as a channel layer. For example, when the thickness of the GaN semiconductor layer is increased by the breakdown voltage of the HEMT may be increased by about 100 volts. During an epitaxial growth process for forming the GaN semiconductor layer, it is necessary to use a substrate with high thermal conductivity and high mechanical strength for a GaN semiconductor material to be deposited thereon; otherwise the substrate may warp or even crack. Thus, compared to a Si substrate, an aluminum nitride (AlN) substrate has higher thermal conductivity and higher mechanical strength, so that a relatively thicker GaN semiconductor layer may be formed on the aluminum nitride (AlN) substrate. For example, the thickness of the GaN semiconductor layer formed on the surface of a Si substrate is from about 2 μm to about 4 μm, while the thickness of the GaN semiconductor layer formed on the surface of an aluminum nitride (AlN) substrate is from about 5 μm to about 15 μm.

Referring to FIG. 3, the substrate structure 100" shown in FIG. 1E is provided. FIG. 3 shows a portion of the substrate structure 100" shown in FIG. 1E, where this portion of the substrate structure 100" includes the bow adjustment layer 104, and other components of the HEMT 300 are formed over the portion of the substrate structure 100". In the embodiment shown in FIG. 3, the substrate 102 is an aluminum nitride (AlN) substrate.

In some embodiments, the HEMT 300 may include a GaN semiconductor layer 112, and the GaB semiconductor layer 112 is formed on the buffer layer 110. In some embodiments, the HEMT 300 may include an AlGaN semiconductor layer 114, and the AlGaN semiconductor layer 114 is formed on the GaN semiconductor layer 112.

In the HEMT 300, two-dimensional electron gas (2DEG, not shown in drawings) is formed at a heterogeneous interface between the GaN semiconductor layer 112 and the AlGaN semiconductor layer 114. In some embodiments, the GaN semiconductor layer 112 and the AlGaN semiconductor layer 114 may have no dopant therein. In some other embodiments, the GaN semiconductor layer 112 and the AlGaN semiconductor layer 114 may be doped, such as with an n-type dopant or a p-type dopant. The GaN semiconductor layer 112 and the AlGaN semiconductor layer 114 may be formed by using epitaxial growth processes, such as metal organic chemical vapor deposition (MOCVD), hydride vapor phase epitaxy (HVPE), molecular beam epitaxy (MBE), suitable similar methods, or a combination thereof.

According to some embodiments of the present disclosure, as shown in FIG. 3, since the substrate 102 is an aluminum nitride (AlN) substrate with high thermal conductivity and high mechanical strength, the GaN semiconductor layer 112 may be deposited to have a thickness T5 which is from about 5 μm to about 15 μm.

In some embodiments, the HEMT 300 may include an isolation structure 117, and the isolation structure 117 is formed in the GaN semiconductor layer 112 and the AlGaN semiconductor layer 114 to define an active region 50. The material used to form the isolation structure 117 may be a dielectric material, such as silicon oxide, silicon nitride, silicon oxynitride, suitable similar materials, or a combination thereof. The isolation structure 117 may be formed by an etching process and a deposition process.

In some embodiments, the HEMT 300 may include source/drain electrodes 118 and a gate electrode 120 between the source/drain electrodes 118, and the source/drain electrodes 118 and the gate electrode 120 are formed on the AlGaN semiconductor layer 114 in the active region 50. In some embodiments, the material of the source/drain electrodes 118 and the gate electrode 120 may be conductive materials, such as metal, metal nitride, or semiconductor materials. The metal may be gold (Au), nickel (Ni), platinum (Pt), palladium (Pd), iridium (Ir), titanium (Ti), chromium (Cr), tungsten (W), aluminum (Al), copper (Cu), suitable similar materials, or a combination thereof. The semiconductor material may be polycrystalline silicon or polycrystalline germanium. The steps of forming the source/drain electrodes 118 and the gate electrode 120 may include depositing a conductive material on the AlGaN semiconductor layer 114, and then patterning the conductive material to form the source/drain electrodes 118 and the gate electrode 120. The source/drain electrodes 118 and the gate electrode 120 may be formed in the same process or may be formed separately in different processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A substrate structure, comprising:
   a ceramic substrate;
   a bow adjustment layer in direct contact with a top surface of the ceramic substrate; and
   a silicon layer in direct contact with the bow adjustment layer, wherein the substrate structure has a total bow value, and the total bow value is from −20 μm to −40 μm, and wherein the ceramic substrate has a positive bow value when the bow adjustment layer has a negative bow value, and the ceramic substrate has a negative bow value when the bow adjustment layer has a positive bow value.

2. The substrate structure as claimed in claim 1, further comprising:
   a buffer layer on the silicon layer, wherein the buffer layer comprises aluminum nitride, gallium nitride, aluminum gallium nitride, or a combination thereof, and the buffer layer has a thickness that is from 0.2 μm to 0.5 μm.

3. The substrate structure as claimed in claim 1, wherein the ceramic substrate is an aluminum nitride substrate.

4. The substrate structure as claimed in claim 1, wherein the ceramic substrate has a bottom surface opposite to the top surface, and the ceramic substrate has a mark on the bottom surface.

5. The substrate structure as claimed in claim 1, wherein the bow adjustment layer comprises silicon oxide, silicon nitride, silicon oxynitride, silicon carbide, or a combination thereof.

6. The substrate structure as claimed in claim 1, wherein the substrate structure has a diameter that is from 6 inches to 8 inches.

7. The substrate structure as claimed in claim 1, wherein the bow adjustment layer has a thickness that is from 0.3 μm to 2.5 μm, and the silicon layer has a thickness that is from 0.1 μm to 0.6 μm.

* * * * *